United States Patent
Griebenow et al.

(10) Patent No.: US 7,871,877 B2
(45) Date of Patent: Jan. 18, 2011

(54) TECHNIQUE FOR STRAIN ENGINEERING IN SILICON-BASED TRANSISTORS BY USING IMPLANTATION TECHNIQUES FOR FORMING A STRAIN-INDUCING LAYER UNDER THE CHANNEL REGION

(75) Inventors: Uwe Griebenow, Markkleeberg (DE); Kai Frohberg, Niederau (DE); Martin Gerhardt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/015,692

(22) Filed: Jan. 17, 2008

(65) Prior Publication Data

US 2008/0296692 A1  Dec. 4, 2008

(30) Foreign Application Priority Data

May 31, 2007  (DE) .............. 10 2007 025 336

(51) Int. Cl.
*H01L 21/8238* (2006.01)
(52) U.S. Cl. .............. 438/199; 257/E29.193; 257/213
(58) Field of Classification Search .......... 257/E29.193, 257/213; 438/199
See application file for complete search history.

(56) References Cited

U.S. PATENT DOCUMENTS 6,297,082 B1 * 10/2001 Lin et al. .............. 438/217
2004/0206950 A1 * 10/2004 Suvkhanov et al. .......... 257/19
2005/0029560 A1 * 2/2005 Wasshuber et al. .......... 257/288
2005/0035409 A1 * 2/2005 Ko et al. .............. 257/350
2005/0285139 A1 * 12/2005 Forbes .............. 257/191
2006/0043430 A1 * 3/2006 Feudel et al. .............. 257/213
2009/0194789 A1 * 8/2009 Griebenow et al. .......... 257/190

FOREIGN PATENT DOCUMENTS

DE  102005051994 A1  5/2007

OTHER PUBLICATIONS

Translation of Official Communication from German Patent Office for German Patent Application No. 10 2007 025 336.4-33 dated Nov. 3, 2008.

* cited by examiner

*Primary Examiner*—Thao X Le
*Assistant Examiner*—Matthew Gordon
(74) *Attorney, Agent, or Firm*—Williams, Morgan & Amerson, P.C.

(57) ABSTRACT

By incorporating a semiconductor species having the same valence and a different covalent radius compared to the base semiconductor material on the basis of an ion implantation process, a strain-inducing material may be positioned locally within a transistor at an appropriate manufacturing stage, thereby substantially not contributing to overall process complexity and also not affecting the further processing of the semiconductor device. Hence, a high degree of flexibility may be provided with respect to enhancing transistor performance in a highly local manner.

18 Claims, 5 Drawing Sheets

TECHNIQUE FOR STRAIN ENGINEERING IN SILICON-BASED TRANSISTORS BY USING IMPLANTATION TECHNIQUES FOR FORMING A STRAIN-INDUCING LAYER UNDER THE CHANNEL REGION

BACKGROUND OF THE INVENTION

1. Field of the Invention

Generally, the present disclosure relates to the formation of integrated circuits, and, more particularly, to techniques for forming transistors having strained channel regions by using embedded strain-inducing semiconductor material to enhance the charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors representing the dominant circuit element, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies so as to reliably and reproducibly create circuit elements of critical dimensions, such as the gate electrode of the transistors, for every new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control.

Since the continuous size reduction of the critical dimensions, i.e., the gate length of the transistors, necessitates the adaptation and possibly the new development of highly complex process techniques concerning the above-identified and many other process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region of a silicon layer having a standard crystalline configuration, i.e., a (100) surface orientation with the channel length direction aligned along the <110> direction, increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region on the basis of epitaxial growth techniques to create tensile or compressive stress that may result in a corresponding strain. Transistor performance may be considerably enhanced by the introduction of stress-creating layers in or below the channel region, and therefore significant efforts have been made to implement the sequence for forming corresponding stress layers into the conventional and well-approved MOS technique. For instance, the required additional epitaxial growth techniques have been developed and implemented into the process flow to form the germanium- or carbon-containing stress layers at appropriate locations in or below the channel region.

In other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing advantages in terms of process complexity over the above-discussed approach requiring additional stress layers within the channel region, the efficiency of the stress transfer mechanism may depend on the process and device specifics and may result in a reduced performance gain for at least one type of transistor.

In another approach, the hole mobility in PMOS transistors is enhanced by forming a strained silicon/germanium layer in the drain and source regions of the transistors, wherein the compressively strained drain and source regions create, for the above standard crystalline conditions, uniaxial strain in the adjacent silicon channel region. To this end, the drain and source regions of the PMOS transistors are selectively recessed, while the NMOS transistors are masked, and subsequently the silicon/germanium layer is selectively formed in the PMOS transistor by epitaxial growth. This technique offers significant advantages in view of performance gain of the PMOS transistor and thus of the entire CMOS device. However, the NMOS transistor may exhibit a reduced performance gain when using a similar technique, for instance on the basis of a silicon/carbon alloy, due to low efficiency of presently available selective epitaxial growth techniques for a silicon/carbon alloy.

Thus, strain engineering by means of embedded semiconductor materials, especially of silicon/germanium, provided as a strained or relaxed layer, depending on the desired effect, has proven to be a powerful means in increasing the device performance of advanced silicon-based transistors. With respect to silicon/germanium material embedded in the drain and source regions, it turns out, however, that the degree of strain induced in the respective channel regions depends on the amount of lattice mismatch between the basic silicon and the embedded semiconductor compound. For silicon/germanium, a maximum concentration of germanium for currently established selective epitaxial growth techniques is limited to approximately 25%, since otherwise germanium conglomeration may occur, which in turn may result in a non-desired stress relief in the corresponding embedded semiconductor compound material, thereby also reducing the strain in the respective channel region. Furthermore, the selective epitaxial growth techniques for forming strained silicon/germanium materials in the drain and source regions of P-channel transistors may result in an asymmetry with respect to performance gain in P-channel transistors and N-channel transistors.

The present disclosure is directed to various techniques and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to methods and semiconductor devices in which the strain-inducing mechanism may be improved without unduly contributing to process complexity and also maintaining a high degree of compatibility with conventional CMOS strategies, in that, locally, a strain-inducing semiconductor material is formed below the respective channel region on the basis of an implantation process. By using a respective implantation process, an appropriate species having the same valence and a different covalent radius compared to the semiconductor base material under consideration may be introduced in a highly localized manner during an appropriate process stage, for instance, prior to the fabrication of respective gate electrodes, thereby obtaining a high degree of flexibility in selecting an appropriate semiconductor species and also with respect to local restriction of the respective strain-inducing region by performing the implantation process on the basis of an appropriately designed mask, such a resist mask. Consequently, the strain-inducing region may be formed in an early manufacturing stage substantially without negatively affecting any further process sequence, thereby offering the possibility of using well-established process techniques for forming sophisticated transistor elements, wherein additional strain-inducing mechanisms may be provided. For instance, the techniques for locally providing a strain-inducing semiconductor material on the basis of an implantation process may be advantageously combined with strain-inducing strategies using embedded semiconductor alloys, such as silicon/germanium and silicon/carbon, formed in a local manner in drain and source regions of the transistor elements. In other aspects, the techniques disclosed herein may be used as single strain-inducing sources or may be combined with "external" strain-inducing sources, such as stressed dielectric layers formed above the transistor elements, thereby providing reduced process complexity compared to selective epitaxial growth techniques usually used for forming embedded strained semiconductor material in the drain and source regions of the transistors, as previously described. In other illustrative aspects, the performance of N-channel transistors may be selectively enhanced on the basis of an implantation species having a higher covalent radius compared to silicon, thereby providing an efficient technique for balancing the asymmetry in performance gain that may exist for "transistor internal" strain-inducing mechanisms between P-channel transistors and N-channel transistors.

One illustrative method disclosed herein comprises forming an implantation mask above a silicon-based layer, wherein the implantation mask covers a portion of the silicon-based layer adjacent to a channel region of a transistor to be formed in and above the silicon-based layer. The illustrative method further comprises implanting a first ionic species into the silicon-based layer to a specified first depth while maintaining a reduced concentration or none of the first ionic species at a surface area of the silicon-based layer. The first ionic species has the same valence and different covalent radius compared to silicon. Furthermore, an anneal process is performed to re-crystallize the silicon-based layer after implanting the first ionic species in order to form a strained silicon-based material near the surface area. Finally, the illustrative method comprises forming a gate electrode structure above the silicon-based layer to define the channel region including a strained silicon-based material.

A further illustrative method disclosed herein comprises forming an implantation mask above a first transistor region and a second transistor region of a semiconductor layer, wherein the implantation mask covers the second transistor region and a portion of the first transistor region. The illustrative method further comprises performing an implantation process for introducing a first species into an exposed portion of the first transistor region, wherein the first species has a different covalent radius and a same valence as a semiconductor base material of the semiconductor layer. Moreover, an anneal process is performed to re-crystallize a lattice structure in the first transistor region in order to form a strained semiconductor material near a surface area of the exposed portion of the first transistor region. Finally, the illustrative method comprises forming a first transistor in and above the first transistor region and a second transistor in and above the second transistor region.

An illustrative semiconductor device disclosed herein comprises a first transistor. The first transistor comprises a strained channel region located at an interface defined by a gate insulation layer and a semiconductor layer. The first transistor further comprises a strain-inducing region located below the channel region and adjacent to drain and source regions of the first transistor, wherein the strain-inducing region comprises a substantially relaxed semiconductor material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates an enhanced strain-inducing mechanism by means of a substantially relaxed semiconductor material having an appropriate lattice structure, such as a diamond-type lattice structure, which may act as a growth template during a re-crystallization process for forming thereon the lattice structure of a channel region of a transistor element. The substantially relaxed semiconductor material, which has a different natural lattice constant compared to the remaining semiconductor material in the channel region and the drain and source regions of the transistor, may be formed in a highly localized manner on the basis of well-established process techniques, that is, on the basis of ion implantation, thereby providing a high degree of flexibility in selecting an appropriate candidate for the isoelectronic components, i.e., for components having the same valence as the semiconductor base material of the transistor, while at the same time not unduly contributing to the overall process complexity. The incorporation of the desired species may be accomplished at any appropriate stage of the manufacturing process so as to not unduly influence well-established process techniques, thereby providing a high degree of compatibility with existing well-approved process flows. Moreover, well-established strategies may be used for forming an appropriate implantation mask in order to substantially determine the lateral position of the substantially relaxed semiconductor material within the active region of the transistor, while the vertical position may be determined on the basis of implantation parameters as may well be determined by referring to well-established simulation techniques and/or experimental data.

In illustrative embodiments disclosed herein, the concept of providing a substantially relaxed semiconductor material below the channel region of a transistor may be selectively used for reducing the non-balance with respect to the availability of strain-inducing mechanisms, which may exist between N-channel transistors and P-channel transistors, by providing an implanted strain-inducing region below the channel region of N-channel transistors, while the P-channel transistor may receive other strain-inducing sources, such as an embedded strained semiconductor material in the respective drain and source regions and/or a dielectric layer formed above the transistor, which may exhibit a high internal compressive stress.

For example, the provision of a highly stressed dielectric material above the basic transistor structure represents an efficient means for generating a desired type and magnitude of strain in the respective channel region, wherein, however, presently available deposition techniques for appropriate dielectric materials, such as silicon nitride, nitrogen-enriched silicon carbide, silicon dioxide and the like, may also suffer from a significant imbalance with respect to tensile and compressive internal stress. That is, in well-established process regimes, highly stressed silicon nitride material is frequently used which may be formed with high intrinsic compressive and tensile stress, wherein the magnitude of the compressive stress may be higher compared to the tensile stress. Thus, in this case, the N-channel transistor may selectively receive the substantially relaxed semiconductor material below the channel region in order to efficiently compensate for a reduced stress provided by the external stress-inducing layer, thereby providing similar transistor performance in highly sophisticated applications, without requiring advanced and, thus, cost-intensive process sequences, such as selective epitaxial growth techniques and the like.

In other illustrative embodiments disclosed herein, the mechanism for providing a substantially relaxed semiconductor material in a highly localized manner may also be applied to P-channel transistors in order to further enhance the strain in the channel region and/or to relax the constraints with respect to other strain-inducing mechanisms. Since the incorporation of the strain-inducing semiconductor material may be accomplished on the basis of implantation processes at an appropriate manufacturing stage, the stress-inducing mechanism may be specifically designed separately for each transistor type or may even be specifically designed with respect to different device areas, such as CPU cores, densely packed memory areas and the like, substantially without affecting the other transistors or device areas. Consequently, by appropriately selecting implantation species and varying the implantation parameters, in combination with the usage of appropriate masking regimes, a desired "patterning" of the strain-inducing mechanism may be accomplished, wherein a local resolution of the strain-inducing mechanism may be modified at a very small scale, such as within individual transistors, and may range up to extended device areas, such as logic portions, memory areas and the like.

In some illustrative embodiments disclosed herein, an atomic species having a covalent radius that is greater than the covalent radius of silicon may be incorporated into portions of the active transistor region to create a respective tensile stress in the channel region located above the specific atomic species upon re-crystallization of the substantially amorphous parts of the transistor region. For example, germanium represents a material that has the same valence as silicon and has an increased covalent radius of 1.22 Å compared to 1.17 Å for silicon. Hence, upon providing a certain amount of germanium atoms within the transistor active region below the channel region, the silicon/germanium alloy may re-crystallize in a substantially relaxed condition, thereby having a slightly larger lattice spacing compared to relaxed silicon. Consequently, the silicon-based material of the channel region may be re-grown in a tensilely strained manner, thereby obtaining the desired degree of strain for enhancing the electron mobility. Since the respective strain-inducing mechanism, i.e., the substantially relaxed silicon/germanium material, may be positioned close to the channel region, a high amount of strain may be obtained, even if the respective germanium content in the substantially relaxed semiconductor material may be lower compared to other strategies in forming silicon/germanium material on the basis of epitaxial growth techniques. In other illustrative embodiments, materials with even greater covalent radii, such as tin (Sn), may be used, which exhibits a covalent radius of 1.40 Å, thereby providing a moderately high lattice mismatch even at reduced concentrations. Thus, tin may be efficiently positioned at any desired location within the transistor active region with sufficient concentration to obtain the desired degree of strain in the channel region. Due to the nature of the implantation process, any other "exotic" candidates may be used for forming the strain-inducing semiconductor material with moderate impact on other device characteristics.

In other illustrative embodiments, a material of reduced covalent radius, such as carbon, may be appropriately positioned to obtain the desired degree of strain or to enhance the strain transfer mechanism obtained by a lower lying substantially relaxed semiconductor material. For instance, a silicon/carbon material may be positioned below the channel region and may be re-grown, thereby forming a substantially relaxed semiconductor portion having a reduced lattice constant compared to relaxed silicon, thereby endowing the silicon material in the channel region with a compressive strain, which may result in a performance gain for P-channel transistors. In still other illustrative embodiments, two different types of atomic species may be combined in order to obtain an overall increase of the efficiency of the strain-inducing effect. In some cases, for a silicon-based semiconductor material, a species of increased covalent radius may be introduced deep into the active region below the channel region while the channel region may receive a species of reduced covalent radius, thereby providing a high vertical "gradient" with respect to the natural lattice spacing, which may result in an even further increased tensile strain in the channel region. Thus, the performance of N-channel transistors may be further enhanced, while modified electronic characteristics of the modified semiconductor material in the channel region may also be taken into consideration so as to design the respective transistor characteristics. Similarly, a material of reduced covalent radius, such as carbon, may be positioned deep in the active region to provide a respective compressive strain in the channel region, which may additionally comprise a component of greater covalent radius, such as germanium, tin and the like, thereby even further enhancing the respective compressive strain in the channel region. Thus, the methods and semiconductor devices disclosed herein provide a high degree of flexibility in individually adapting the strain characteristics in the channel regions of transistor elements on the basis of implantation techniques.

Figure 1A:
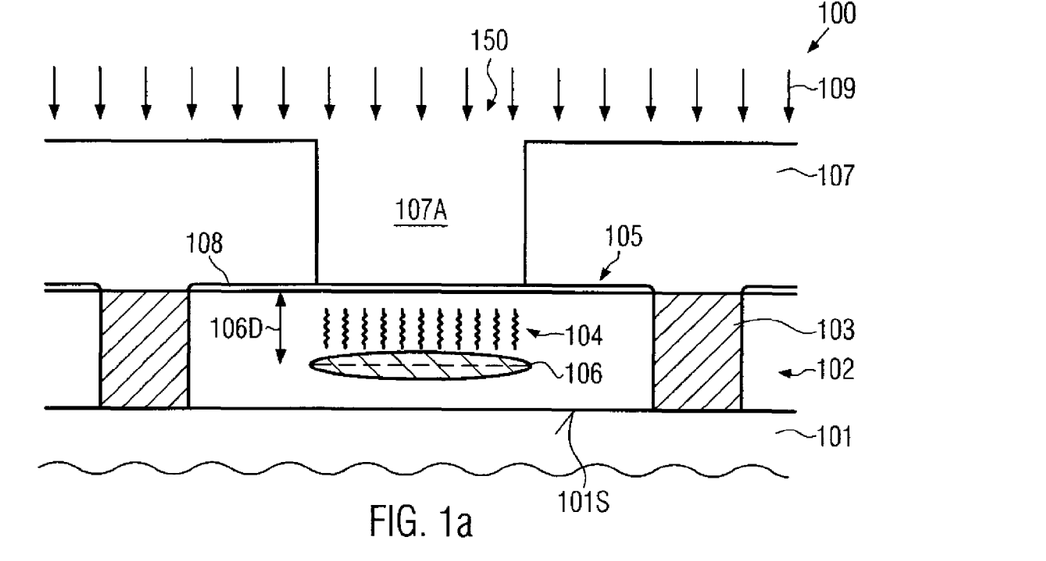
FIGS. 1a-1d schematically illustrate cross-sectional views of a semiconductor device during various manufacturing stages for locally forming a relaxed semiconductor region below a channel region of a field effect transistor, according to illustrative embodiments.

FIG. 1a schematically illustrates a cross sectional view of a semiconductor device 100 comprising a substrate 101, above which is formed a semiconductor layer 102. The substrate 101 may represent any appropriate carrier material for forming thereabove the semiconductor layer 102. For instance, the substrate 101 may represent a bulk semiconductor substrate, wherein the semiconductor layer 102 may be an upper portion thereof or any other semiconductor material formed on the bulk semiconductor substrate. In other illustrative embodiments, the substrate 101 may represent a substantially crystalline semiconductor material having formed thereon an insulating layer (not shown), also referred to as a buried insulating layer, such as a silicon dioxide layer and the like, on which may be formed the semiconductor layer 102. In this case, the substrate 101, in combination with the semiconductor layer 102, may represent a semiconductor-on-insulator (SOI) architecture. It should also be appreciated that the semiconductor device 100 may have incorporated therein specific device areas having an SOI architecture, while other device areas may be formed on the basis of a so-called bulk configuration, that is, the semiconductor layer 102 may not be restricted in the vertical direction by a buried insulating material.

In this respect, it should be appreciated that any positional information is to be considered as a relative position statement, wherein the substrate 101 or a surface thereof 101S may be used as a reference. For example, a vertical direction may represent a direction that is substantially perpendicularly oriented to the surface 101S, while a horizontal direction may be considered as a direction that extends substantially parallel to the surface 101S. Similarly, a first feature may be positioned "above" a second feature, when the first and second features are located at the same side of the surface 101S and when a distance of the first feature from the surface 101S is greater than the distance of the second feature. The same definition holds true for any other positional statement given herein.

In some illustrative embodiments, the semiconductor layer 102 may represent a silicon-based semiconductor layer, at least at an initial manufacturing stage, wherein the predominant species is silicon. In other cases, the semiconductor layer 102 may represent any other type of semiconductor material, when a corresponding strain-inducing mechanism may significantly modify the respective charge carrier mobility in the semiconductor material of the layer 102. In the following, the semiconductor layer 102 may also be referred to as a silicon layer, since presently, and in the near future, complex logic circuitry, such as CPUs, storage chips and the like, are and will be formed on the basis of silicon material.

Furthermore, the semiconductor device 100 may comprise at this manufacturing stage an isolation structure 103, such as a shallow trench isolation (STI) and the like, which may define a respective active region 105 within the semiconductor layer 102. That is, the active region 105 may represent a semiconductor region having incorporated therein, or may receive an appropriate dopant species so as to laterally and/or vertically create, a desired dopant profile in order to appropriately "pattern" the conductivity of the semiconductor material. The active region 105 may be designed to receive one or more transistor elements therein, depending on the device requirements. In the embodiment shown, the active region 105 may represent a region for forming therein and thereabove a field effect transistor 150. The active region 105 may comprise an area 104, a portion of which may form a conductive channel during the operation of the transistor 150, wherein, for convenience, the area 104 may also be referred to as a channel region, although the lateral and vertical dimensions of the area 104 may not conform to the respective lateral and vertical dimensions of the actual channel. That is, the area 104 may extend in the lateral direction beyond the actual channel region still to be defined. Furthermore, at this manufacturing stage, a semiconductor material 106 may be positioned within the active region 105 below the channel region 104, wherein the lateral extension of the semiconductor material 106 may substantially correspond to the lateral dimensions of an opening 107A of an implantation mask 107. The vertical position of the semiconductor material 106 may be defined by a concentration maximum of an implantation species, which may represent an atomic species having the same valence as the base semiconductor material of the layer 102, such as silicon, while differing therefrom by its covalent radius. Thus, when a specified depth of the semiconductor material 106 is referred to, i.e., of the implantation species comprised therein, the depth of the concentration maximum may be referred to, while it should be appreciated that, due to the nature of the implantation process, significant amounts of the respective implantation species may also be present below and above the respective specific depth. Thus, the specific depth 106D indicated in FIG. 1a should represent the concentration maximum of the implantation species of the material 106.

As previously explained, the respective implantation species may be an isoelectronic atomic species with respect to, for instance, silicon, while the respective covalent radius may be different, wherein a greater covalent radius may result in a tensile strain in the channel region 104 at a later manufacturing stage, while a reduced covalent radius may result in a compressive stress. In some illustrative embodiments, the transistor 150 may represent an N-channel transistor, wherein the semiconductor material 106 may comprise germanium so as to form a silicon/germanium alloy with an increased natural lattice constant. In other cases, alternatively or additionally to germanium, tin or other materials of increased covalent radius may be incorporated. At the manufacturing stage as shown, the semiconductor material 106 and the channel region 104 may exhibit significant damage in the crystalline structure or may be in a substantially amorphous state, that is, the electronic characteristics of the material in the channel region 104 and the material 106 may substantially correspond to characteristics of a material of the same composition being formed on a non-crystalline carrier material with a typical grain size of several nanometers and significantly less.

The semiconductor device 100 as shown in FIG. 1a may be formed on the basis of the following processes. After providing the substrate 101, the semiconductor layer 102 may be formed thereon, or the substrate 101 may be obtained in a state in which the semiconductor layer 102 may have the required composition and characteristics for forming therein and thereon respective transistor elements, such as the transistor 150. Next, the isolation structure 103 may be formed on the basis of well-established techniques, including sophisticated photolithography, anisotropic etch, deposition and planarization processes. Thereafter, the surface of the semiconductor layer 102, having incorporated therein the respective isolation structures 103, may be treated to obtain an optional protection layer 108, which may be provided in the form of an oxide layer and the like. Subsequently, the implantation mask 107 may be formed on the basis of photolithography techniques, wherein the opening 107A may be designed so as to substantially correspond to the channel width of the transistor under consideration. For this purpose, substantially the same lithography tools may be used as typically required for defining gate electrodes above the active region 105, wherein, for instance, respective resist features may be formed as are typically used for providing an etch mask for gate electrodes. Thereafter, the respective resist features may be embedded into an appropriate material, such as any appropriate polymer material, resist material and the like, and thereafter the respective resist features may be selectively removed, thereby obtaining the opening 107A. In other cases, an appropriately designed photolithography mask may be used, in which the opening 107A may then be defined according to conventional photolithography techniques.

Next, an ion implantation process 109 may be performed in order to introduce the appropriate ionic species for defining the semiconductor material 106 at the specific depth 106D with lateral dimensions that are substantially determined by the opening 107A. It should be appreciated that the ion implantation process 109 may include a plurality of individual implantation steps to obtain the desired configuration of the semiconductor material 106 and the channel region 104. For instance, in one illustrative embodiment, the process 109 may comprise an amorphization implantation step in order to create severe crystal damage in the exposed portion of the semiconductor layer 102 prior to actually implanting the specific ionic species having the different covalent radius. For instance, a heavy inert species, such as xenon and the like, may be used to substantially amorphize the exposed portion of the semiconductor layer 102 down to a desired depth. It should be appreciated that, in an SOI configuration, that is, when the semiconductor layer 102 is vertically bordered by a buried insulating layer, the amorphization implantation may reach deep into the semiconductor layer 102 but may nevertheless maintain a certain portion of the original semiconductor material, which may then be used as a growth template during a subsequent re-crystallization process.

In other cases, the incorporation of the specified ionic species, such as germanium, tin, carbon and the like, may per se result in severe crystalline damage so as to obtain a substantially amorphized state of the material 106 and the channel region 104. In other illustrative embodiments, the implantation process 109 may comprise an amorphization implantation step on the basis of the base component of the semiconductor layer 102, such as silicon, when a silicon-based material is considered, thereby providing the possibility of individually adjusting the process parameters for creating the desired degree of lattice damage without introducing non-desired atomic species, such as heavy inert atoms and the like, while, in a subsequent implantation process, the process parameters may be adjusted to obtain the desired dose and, thus, concentration of the species under consideration. It should be appreciated that appropriate process parameters, such as implantation energy and dose, may be readily determined on the basis of simulations, experiment, experience and the like. Furthermore, in some illustrative embodiments, when the optional protection layer 108 is provided, a respective etch process may be performed prior to the implantation process 109, when the effect of the layer 108 is deemed inappropriate for performing the implantation process 109, while, in other cases, the layer 108 may be maintained.

Figure 1B:
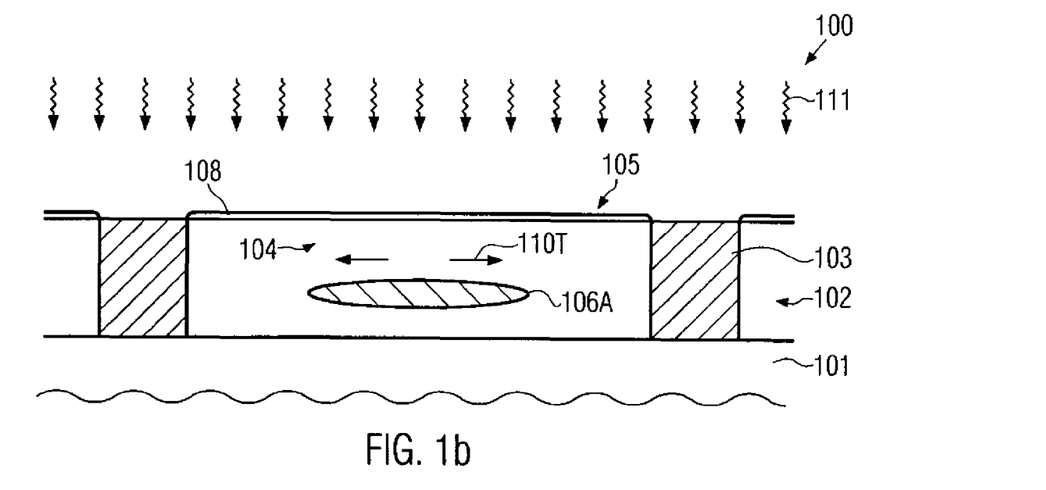

FIG. 1b schematically illustrates the semiconductor device 100 after the removal of the implantation mask 107 and during an anneal process for re-crystallizing the damaged crystalline structure of the semiconductor material 106 and the channel region 104. The anneal process 111 may be performed on the basis of well-established anneal processes, such as rapid thermal anneal (RTA), or any other high temperature processes with temperatures in the range of approximately 600-1300° C. In other cases, additionally or alternatively, sophisticated anneal techniques, such as laser-based or flash-based anneal processes, may be used if a reduced degree of diffusion is required for the semiconductor material 106. Thus, depending on the process parameters used during the anneal process 111, the lateral and vertical dimensions of the semiconductor material 106 may increase, thereby forming a substantially relaxed semiconductor material 106A, wherein, however, the specified depth 106D may be substantially maintained. As previously explained, during the anneal process 111, the lattice structure in the damaged area may be re-established, wherein the remaining crystalline portions adjacent to the semiconductor material 106 may act as a growth template. Thus, due to the concentration gradient, at least in the vertical direction with respect to the specified depth 106D in the material 106, the re-crystallization may take place from bottom to top, wherein the increasing concentration may result in a gradual degree of relaxation in the material 106A, that is, the material 106A may substantially take on a lattice constant close to its natural lattice constant in significant portions thereof, wherein this lattice constant may also be adopted by the semiconductor material in the channel region 104, which may therefore be re-grown according to the natural lattice constant of the material 106. For a germanium-based material or a tin-based material, therefore, a high tensile strain 110 may be created in the channel region 104.

Figure 1C:
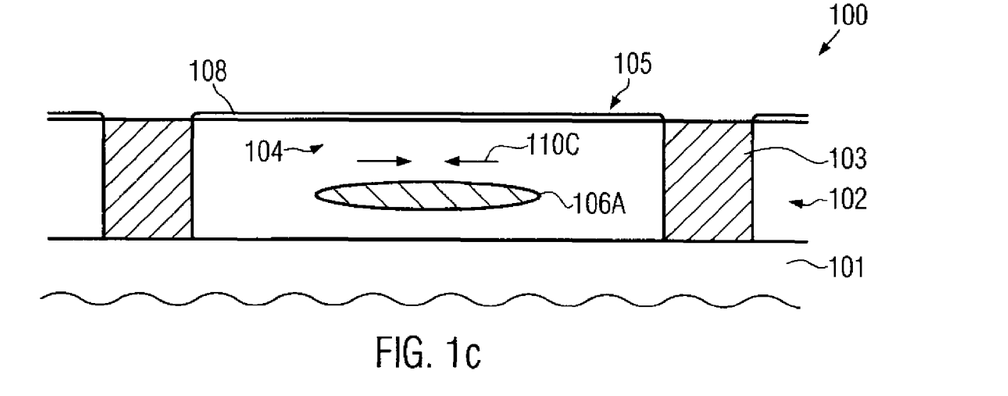

FIG. 1c schematically illustrates the semiconductor device 100 when the semiconductor material 106 comprises a component having a smaller covalent radius compared to the silicon material of the semiconductor layer 102. In this case, a high compressive strain 110C may be obtained in the channel region 104. For instance, the semiconductor material 106A may comprise carbon with a concentration of 0.1 to 1% at the concentration maximum, i.e., at the specified depth 106D.

Thereafter, the further processing may be continued on the basis of well-established process techniques, wherein, if required, additional strain-inducing mechanisms may be provided for the transistor 150, such as embedded strained semiconductor material, such as silicon/germanium, silicon/tin, silicon/germanium/tin, when P-channel transistors are considered, in which case the semiconductor material 106A may be configured as shown in FIG. 1c.

Figure 1D:
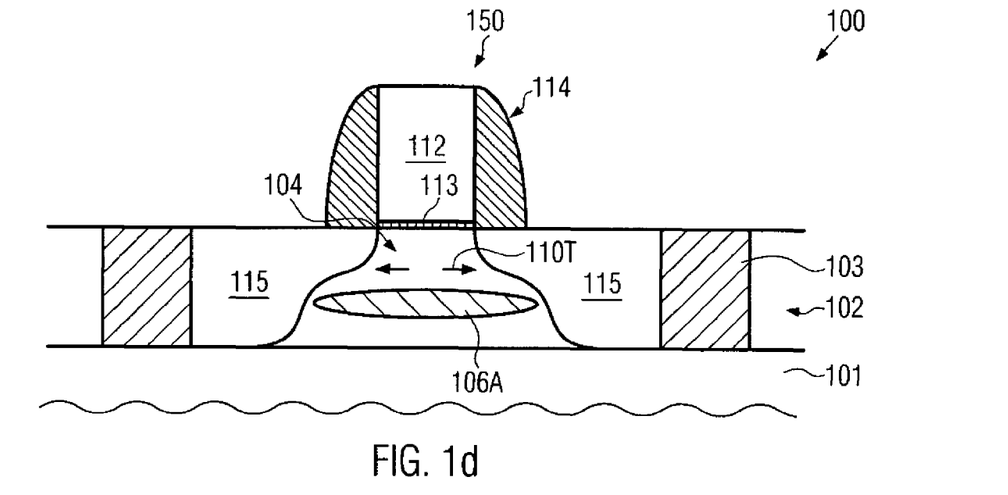

FIG. 1D schematically illustrates the semiconductor device 100 wherein the transistor 150 is at an advanced manufacturing stage. As shown, the transistor 150 may comprise a gate electrode 112 which may, for instance, be comprised of polysilicon or any other appropriate gate electrode material, formed on the gate insulation layer 113, which separates the gate electrode 112 from the channel region 104. Furthermore, a sidewall spacer structure 114 may be formed on the sidewalls of the gate electrode 112 in accordance with process requirements for defining respective drain and source regions 115 according to a desired lateral and vertical dopant profile.

The transistor 150 as shown may be formed on the basis of well-established techniques, including the formation of the gate insulation layer 113 and the patterning of the gate electrode 112 in accordance with well-established photolithography and sophisticated etch techniques, wherein, as previously explained, in some cases, substantially the same lithography masks may be used, as previously employed for defining the opening 107A. Thereafter, the drain and source regions 115 may be formed on the basis of ion implantation in combination with respective spacer elements of the structure 114 as required by device characteristics. It should be appreciated that an appropriate semiconductor alloy may be incorporated into the drain and source regions 115 as previously explained when an additional stain-inducing source is desired. After incorporating the appropriate dopant species for defining the drain and source regions 115, respective anneal processes may be performed to activate the dopants and re-crystallize implantation-induced damage. In some illustrative embodiments, the anneal process 111 (FIG. 1b) may be omitted in the early manufacturing stage as shown in FIG. 1b, and may be incorporated or may represent a part of the anneal process for activating the dopants and re-crystallizing the drain and source regions 115, when the substantially amorphized state of the channel region 104 may be compatible with respective processes for forming the gate insulation layer 113. Thereafter, metal silicide regions may be formed, if required, within the drain and source regions 115 and the gate electrode 112 on the basis of well-established techniques. Next, a highly stressed dielectric material may be formed above the transistor 150, which in the present example may exhibit a high intrinsic tensile stress so as to further enhance the tensile strain 110T in the channel region 104.

As a consequence, the transistor 150 may be provided with an internal strain-inducing mechanism, wherein its source, i.e., the material 106A, is closely positioned at the channel region 104, thereby providing a high degree of internal strain 110T, 110S, wherein even moderately low concentrations of implantations species, such as germanium, tin, carbon and the like, may suffice for obtaining a desired high strain level. Furthermore, due to the nature of the implantation process 109, a high degree of flexibility may be obtained with respect to using different species and appropriately positioning the semiconductor material 106A within the active region 105. Furthermore, undue modifications of subsequent processes may be avoided, thereby not unduly contributing to the overall process complexity.

Figure 1E:
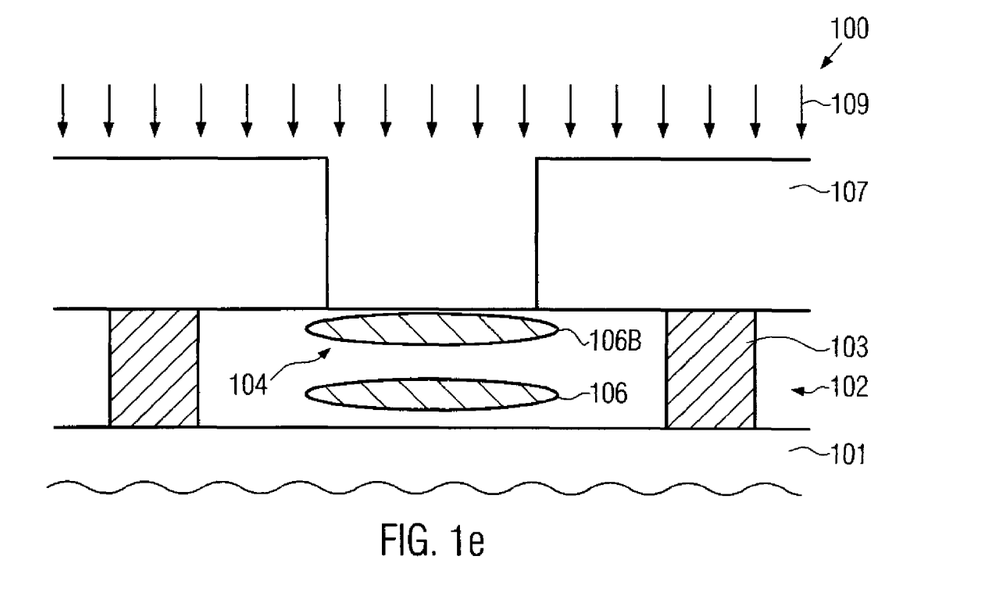
FIGS. 1e-1f schematically illustrate cross-sectional views of a semiconductor device during various manufacturing stages in forming a local strain-inducing relaxed semiconductor material on the basis of a first species, wherein a second semiconductor species is formed in the channel region to enhance the strain-inducing mechanism, according to still further illustrative embodiments.

FIG. 1e schematically illustrates the semiconductor device 100 according to further illustrative embodiments, wherein, during the implantation process 109, at least one further species is introduced into the semiconductor layer 102 to form a second semiconductor material 106B within the channel region 104. The semiconductor material 106B may have incorporated therein an atomic species that has the same valence as the base material, such as silicon, but may differ in its covalent radius and may have a reduced covalent radius when a high tensile strain is to be created, and may have a greater covalent radius when an increased compressive strain is to be generated. The further species for forming the semiconductor material 106B may be introduced by the ion implantation process 109 on the basis of respectively selected process parameters so as to position the concentration maximum at a reduced depth to avoid a significant overlap of the materials 106 and 106B. However, in other cases, the material 106B may be positioned at any desired depth, when the resulting vertical concentration profile is required for adjusting the strain conditions during and after the anneal process. Appropriate process parameters may be readily established on the basis of simulation, experience and experiment.

Figure 1F:
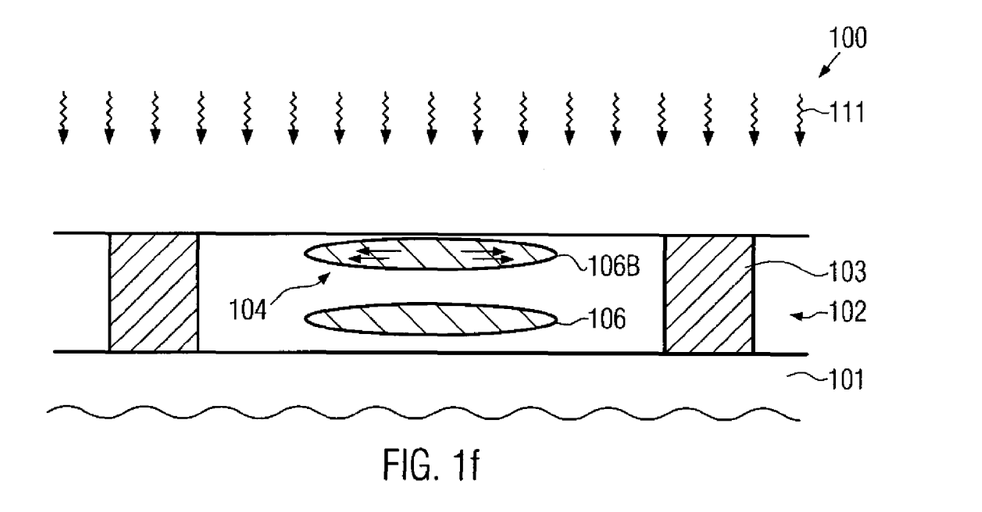

FIG. 1f schematically illustrates the semiconductor device 100 during the anneal process 111, wherein the substantially amorphized portions may be re-crystallized, wherein, depending on the process parameters, a certain degree of diffusion may also occur and may change the overall dimensions of the regions defined by the semiconductor material 106B and 106A. For example, in view of avoiding undue lattice defects, a moderately low concentration gradient may be established between the regions 106A, 106B, while even a substantially "undoped" silicon material may be formed therebetween. However, as previously explained, due to the nature of the implantation process, and by appropriately selecting process parameters for the anneal process 111, nearly any desired configuration of the transition between the regions 106A, 106B may be obtained. Thus, upon re-crystallization, an even increased lattice mismatch between the regions 106A and the channel region 104 including the region 106B may be obtained, so that the respective strain therein may be even further increased. The concentration within the channel region 104, i.e., the region 106B, may also be selected with respect to a modification of the electronic characteristics caused by the additional component, such as carbon and the like, in order to also adjust band gap energies and the like in view of transistor performance gain. Even for moderately low concentrations in the region 106B, nevertheless, a significantly enhanced overall strain may be created. As a consequence, the strain and the electronic characteristics of the channel region 104 may be individually adjusted for each transistor 150, thereby obtaining a high degree of flexibility in designing the transistor characteristics, substantially without negatively affecting the characteristics of other transistor devices.

With reference to FIGS. 2a-2d, further illustrative embodiments will now be described in which different types of transistors may individually obtain an appropriate implant region for creating a respective stain in the channel region.

Figure 2A:
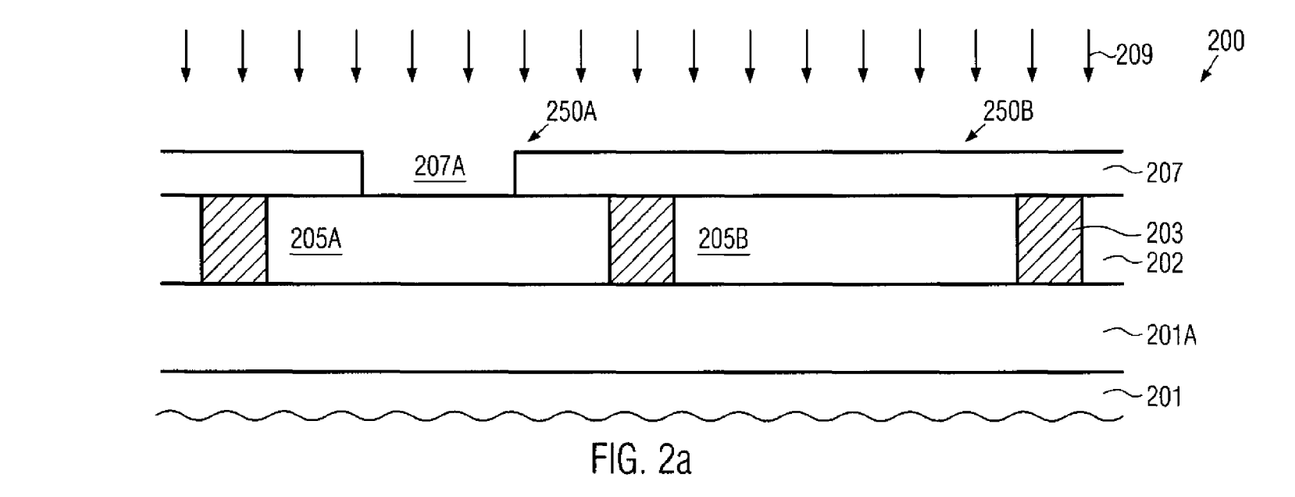
FIGS. 2a-2d schematically illustrate cross-sectional views of a semiconductor device including a first and second transistor, wherein one of the two transistors receives a substantially relaxed semiconductor material below the channel region in order to selectively enhance transistor performance of one type of transistors, according to still other illustrative embodiments.

FIG. 2a schematically illustrates a cross-sectional view of a semiconductor device 200 comprising a substrate 201 having formed thereabove a semiconductor layer 202, such as a silicon-based semiconductor layer. Furthermore, in the embodiment shown, a buried insulating layer 201A may be formed between the substrate 201 and the semiconductor layer 202. It should be appreciated, however, as previously explained, the buried insulating layer 201A may be omitted in other cases, i.e., when a bulk architecture is considered. The semiconductor layer 202 comprises therein respective isolation structures 203 so as to define a first active region 205A for a first transistor 250A and a second active region 205B for a second transistor 250B. Moreover, an implantation mask 207, such as a resist mask, may be formed above the first and the second active regions 205A, 205B so as to cover the second region 205B while exposing a portion of the first active region 205A which substantially corresponds to a channel region of the first transistor 250A. With respect to components described so far, the same criteria apply as previously explained with reference to the device 100. Thus, any explanation with respect to the specifics of these features and processes for forming the same will be omitted here.

Based on the opening 207A, an implantation process 209 may be performed in order to incorporate a desired species at a specified depth, as is also previously explained with reference to the device 100. For example, if the performance of the transistor 250A is to be selectively increased, an appropriate atomic species may be incorporated so as to obtain a compressive or tensile strain. For example, the first transistor 250A may represent an N-channel transistor and, hence, a species having a greater covalent radius, such as germanium, tin and the like, may be incorporated during the implantation process 209. As previously explained, the process 209 may also include a pre-amorphization implantation based on an appropriate implantation species.

Figure 2B:
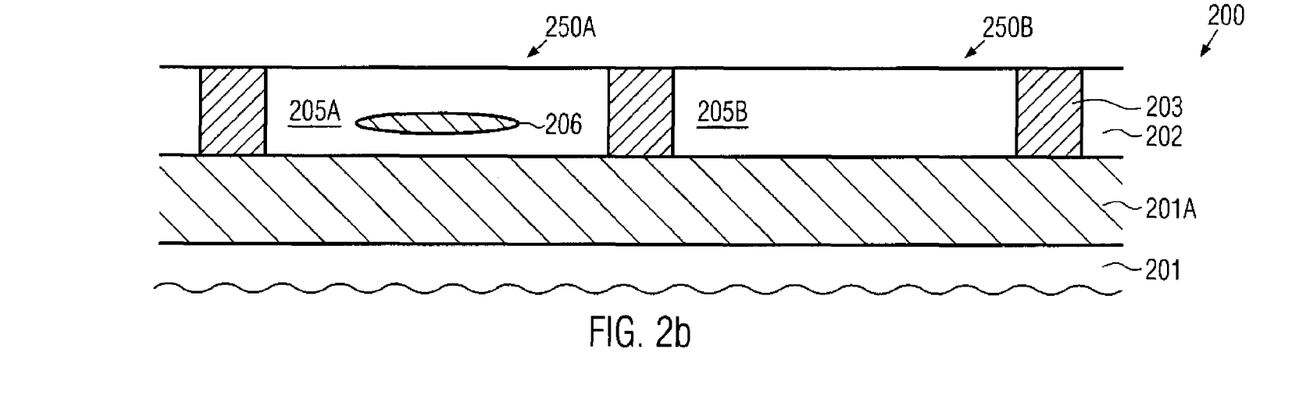

FIG. 2b schematically illustrates the semiconductor device 200 during the implantation process 209 and the removal of the resist mask 207. Consequently, a substantially amorphous region 206 is positioned within the active region 205A at a specified depth defined by the implantation parameters, while a horizontal position is substantially defined by the resist mask 207, as previously explained. Consequently, a respective strain-inducing mechanism may be selectively provided in the first transistor 250A. In other illustrative embodiments (not shown), a respective strain-inducing mechanism may be provided in the transistor 250B or may be provided in both transistors 250A, 250B. In this case, the semiconductor device 200 as shown in FIG. 2b may receive a further resist mask (not shown) to expose a portion of the second transistor 250B for a further implantation process in order to incorporate an appropriate species for inducing a desired type of strain in the transistor 250B.

Figure 2C:
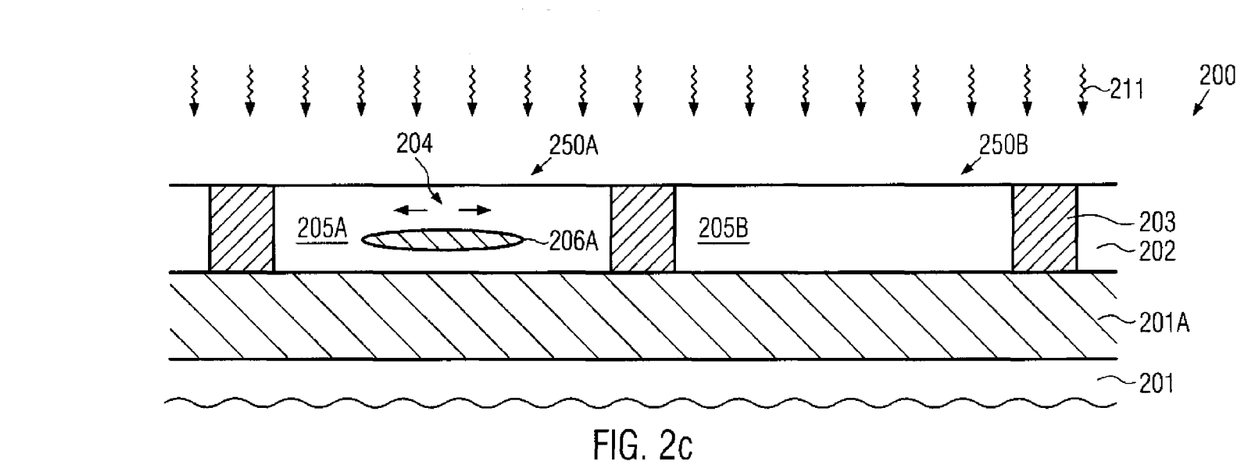

FIG. 2c schematically illustrates the semiconductor device 200 during an anneal process 211 for re-crystallizing the substantially amorphized portions in the active region 205A, thereby obtaining the desired type of strain in the channel region 204, which may be a tensile strain, when the region 206 comprises germanium, tin and the like. In other illustrative embodiments, when the second transistor 250B may also have incorporated therein a respective strain-inducing semiconductor material, the anneal process 211 may be performed after the respective implantation process to thereby re-crystallize the first and second active regions 205A, 205B in a common anneal process.

Thereafter, the further processing may be continued on the basis of well-established process techniques, wherein, for instance, additional strain-inducing mechanisms may be used, such as embedded strained semiconductor material and the like, as previously explained. For instance, if the second transistor 250B represents a P-channel transistor, drain and source areas thereof may be selectively recessed and refilled by a selective epitaxial growth technique using a silicon/germanium semiconductor alloy for creating a respective compressive stress in the channel region of the transistor 250B. Similarly, if an additional strain-inducing mechanism is desired in the first transistor 250A, a silicon/carbon material may be formed in the respective drain and source areas, thereby resulting in additional tensile strain in the channel region. Thereafter, the further processing may be continued as previously described with reference to device 100.

Figure 2D:
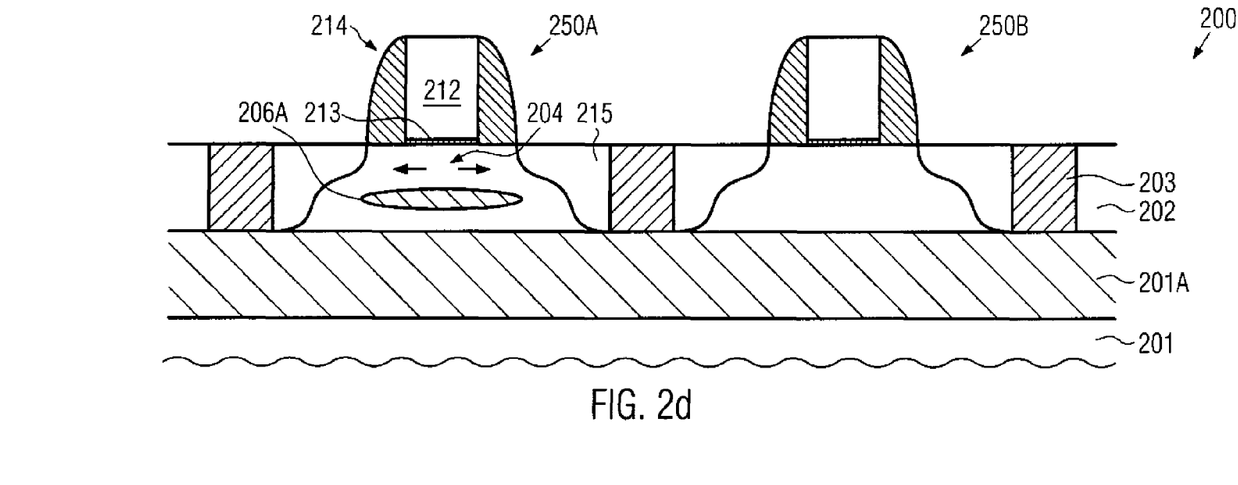

FIG. 2d schematically illustrates the semiconductor device 200 in an advanced manufacturing stage, wherein the respective transistors 250A, 250B may comprise a gate electrode structure 212 formed on a gate insulation layer 213, which separates the gate electrode 212 from the respective channel regions 204, which, in the embodiment shown, is the strained channel region in the first transistor 250A, while the second transistor may have a substantially non-strained channel region 204. Furthermore, the respective sidewall spacer structure 214 may be formed on the sidewalls of the gate electrode 212, and drain and source regions 215 may be defined in the active regions 205A, 205B. As shown, the strain-inducing semiconductor material 206B may, in some illustrative embodiments, be spaced apart from the respective drain and source regions 215, thereby providing substantially the same electronic characteristics at the respective PN junctions compared to a conventional device, while nevertheless providing the enhanced strain in the channel region 204. In other cases, when it is deemed appropriate, the semiconductor material 206 may have a certain overlap with the drain and source regions 215.

It should be appreciated that the first and second transistors 250A, 250B may represent transistors of different conductivity type, wherein one of the transistors may receive an additional strain-inducing mechanism provided by the material 206, while, in other cases, both transistors may have a respective strain-inducing material positioned below the respective channel regions. In still other cases, the transistors 250A, 250B may represent transistors of different device areas, such as a CPU core and a memory area and the like, wherein the technique disclosed herein, which is based on an implantation process, provides a high degree of flexibility in appropriately designing the respective strain-inducing mechanism. For instance, the size, position and the concentration in the respective regions 106, 206 may be readily modified in accordance with device requirements.

As a result, the subject matter disclosed herein provides an efficient technique for positioning a strain-inducing semiconductor material below a channel region of respective transistor elements by ion implantation at an appropriate manufacturing stage, substantially without negatively affecting other transistor types and the subsequent manufacturing process. For example, by incorporating a germanium material or a tin material into a silicon-based active region of an N-channel transistor, a high tensile strain may be created in the respective channel region. Similarly, the performance of P-channel transistors may be increased by incorporating an appropriate material, such as carbon, while both strategies may be readily combined in any appropriate manner so as to individually adjust the performance gain of transistors. In some illustrative embodiments, different types of semiconductor species of the same valence and different covalent radius may be incorporated into the respective channel regions in order to even further enhance the strain-inducing mechanism and possibly adjust the electronic characteristics of the channel regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an implantation mask above a silicon-based layer, said implantation mask covering a portion of said silicon-based layer adjacent to a channel region of a transistor to be formed in and above said silicon-based layer;
    bombarding said silicon-based layer with a first ionic species to implant the first ionic species into said silicon-based layer to a specified first depth while maintaining a reduced concentration of said first ionic species at a surface area of said silicon-based layer to define a first implant region, said first ionic species having the same valence and a different covalent radius compared to silicon;
    implanting a second ionic species to a specified second depth into said silicon-based layer to define a second implant region separate from said first implant region, said specified second depth being less than said specified first depth, said second ionic species having the same valence as silicon;
    performing an anneal process to re-crystallize said silicon-based layer after implanting said first and second ionic species so as to form a strained silicon-based material near said surface area; and
    forming a gate electrode structure above said silicon-based layer so as to define said channel region including said strained silicon-based material.

2. The method of claim 1, further comprising performing an implantation process designed to create lattice damage in an exposed portion of said silicon-based layer prior to implanting said first ionic species.

3. The method of claim 1, wherein said transistor represents an N-channel transistor and said first ionic species has a covalent radius greater than silicon.

4. The method of claim 3, wherein said first ionic species comprises germanium.

5. The method of claim 3, wherein said first ionic species comprises tin.

6. The method of claim 1, wherein said transistor represents a P-channel transistor and said first ionic species has a covalent radius less than silicon.

7. The method of claim 6, wherein said first ionic species comprises carbon.

8. The method of claim 1, wherein said implantation mask covers a portion of an area of the silicon-based layer that corresponds to drain and source regions of said transistor.

9. The method of claim 1, further comprising forming an isolation structure prior to implanting said first ionic species.

10. The method of claim 1, wherein a covalent radius of said second ionic species is less than the covalent radius of silicon.

11. The method of claim 1, wherein said implantation mask covers a portion of said silicon-based layer that corresponds to a second transistor.

12. A method, comprising:
    forming an implantation mask above a first transistor region and a second transistor region of a semiconductor layer, said implantation mask covering said second transistor region and a portion of said first transistor region;
    performing an implantation process for introducing a first species into an exposed portion of said first transistor region by bombarding said exposed portion with said first species to define a first implant region at a first specified depth, said first species having a different covalent radius and the same valence as a semiconductor base material of said semiconductor layer;

implanting a second species into said silicon-based layer to define a second implant region at a second specified depth separate from said first implant region, said second specified depth being less than said first specified depth, said second species having the same valence as said semiconductor base material;

performing an anneal process to re-crystallize a lattice structure in said first transistor region so as to form a strained semiconductor material near a surface area of said exposed portion of the first transistor region; and forming a first transistor in and above said first transistor region and a second transistor in and above said second transistor region.

13. The method of claim 12, further comprising performing a pre-amorphization implantation process to create lattice damage in said exposed portion of the first transistor region prior to performing said implantation process.

14. The method of claim 13, wherein said pre-amorphization implantation process is performed on the basis of said implantation mask.

15. The method of claim 12, wherein said first species has a greater covalent radius compared to said base material of said semiconductor layer.

16. The method of claim 15, wherein said base material comprises silicon and said first species comprises at least one of germanium and tin.

17. The method of claim 1, wherein performing the anneal process to re-crystallize said silicon-based layer after implanting said first and second ionic species so as to form said strained silicon-based material near said surface area comprises forming a first strained region and a second non-overlapping strained material region, with a third region not doped by said first or second ionic species disposed therebetween.

18. The method of claim 12, wherein performing the anneal process to re-crystallize the lattice structure in said first transistor region so as to form the strained semiconductor material comprises forming a first strained region and a second non-overlapping strained material region, with a third region not doped by said first or second species disposed therebetween.

* * * * *